United States Patent
Ku

(10) Patent No.: US 10,037,291 B2
(45) Date of Patent: Jul. 31, 2018

(54) SEMICONDUCTOR MEMORY APPARATUS AND DATA INPUT/OUTPUT METHOD THEREOF

(71) Applicant: SK hynix Inc., Icheon-si, Gyeonggi-do (KR)

(72) Inventor: Kie Bong Ku, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 468 days.

(21) Appl. No.: 14/713,738

(22) Filed: May 15, 2015

(65) Prior Publication Data

US 2016/0224480 A1 Aug. 4, 2016

(30) Foreign Application Priority Data

Jan. 29, 2015 (KR) ........................ 10-2015-0014435

(51) Int. Cl.
*G11C 7/00* (2006.01)
*G06F 13/16* (2006.01)
*G06F 13/42* (2006.01)

(52) U.S. Cl.
CPC ...... *G06F 13/1668* (2013.01); *G06F 13/4204* (2013.01); *G06F 13/4282* (2013.01)

(58) Field of Classification Search
CPC ............. G06F 13/1668; G06F 13/4204; G06F 13/4282
USPC ........................................ 365/189.11, 189.08
See application file for complete search history.

(56) References Cited

U.S. PATENT DOCUMENTS

| | | | | |
|---|---|---|---|---|
| 6,721,194 B2* | 4/2004 | Sekiguchi | .............. | G11C 5/025 365/149 |
| 6,894,912 B2* | 5/2005 | Sekiguchi | .............. | G11C 5/025 711/108 |
| 6,922,359 B2* | 7/2005 | Ooishi | ................... | G11C 16/10 365/185.11 |
| 6,990,037 B2* | 1/2006 | Sekiguchi | .............. | G11C 5/025 365/207 |
| 7,184,326 B2* | 2/2007 | Sekiguchi | .............. | G11C 5/025 365/189.05 |
| 7,262,983 B2* | 8/2007 | Sekiguchi | .............. | G11C 5/025 365/205 |
| 8,036,049 B2 | 10/2011 | Park | | |
| 8,364,913 B2 | 1/2013 | Kwak | | |
| 8,862,811 B2* | 10/2014 | Shido | ...................... | G06F 12/00 711/105 |
| 2015/0095520 A1* | 4/2015 | Kwack | ................ | G06F 13/4234 710/14 |
| 2015/0254136 A1* | 9/2015 | Hoya | .................. | G06F 11/1012 714/764 |

* cited by examiner

*Primary Examiner* — Viet Q Nguyen
(74) *Attorney, Agent, or Firm* — William Park & Associates Ltd.

(57) ABSTRACT

A semiconductor memory apparatus may include a write data bus inversion unit and a write data polarity change unit. The write data bus inversion unit may invert a level of an input data and may generate an inversion change data when a majority of the input data have a predetermined level. The write data polarity change unit may invert a level of the inversion change data based on a write signal and a first bank address signal and generate a polarity change data.

14 Claims, 6 Drawing Sheets

SEMICONDUCTOR MEMORY APPARATUS AND DATA INPUT/OUTPUT METHOD THEREOF

CROSS-REFERENCES TO RELATED APPLICATION

The present application claims priority under 35 U.S.C. § 119(a) to Korean application number 10-2015-0014435, filed on Jan. 29, 2015 in the Korean Intellectual Property Office, which is incorporated herein by reference in its entirety as set forth in full.

BACKGROUND

1. Technical Field

Various embodiments generally relate to a semiconductor apparatus, and more particularly, to a memory apparatus and data input/output method thereof.

2. Related Art

In general, a semiconductor memory apparatus stores and outputs data under control of an external apparatus such as a controller. The semiconductor memory apparatus may include a memory bank and a data pad. The memory bank may have a plurality of memory cell arrays. The semiconductor memory apparatus receives data through the data pad, and stores the data into the memory bank. The semiconductor memory apparatus may output the data through the data pad. Generally, the data is transmitted through data transmission line coupled between the memory bank and the data pad.

The data transmission line may be disposed across a peripheral area of the memory bank, and may be relatively long. Also, the semiconductor memory apparatus may receive serial data through the data pad, and transform the serial data to parallel data. The semiconductor memory apparatus may transmit the parallel data through the data transmission line. Thus, the semiconductor memory apparatus may relatively include a lot of data transmission lines. Therefore, the amount of current consumed for transmission of the data through the data transmission line may affect power consumption of the semiconductor memory apparatus.

The research and development (R&D) trend for the semiconductor memory apparatus is directed towards achieving high integration, high speeds, and low power consumption. As R&D focuses on "green" memory, levels of an external source voltage is lowered and power consumption of the semiconductor memory apparatus is lessoned. R&D may also focus on reducing the power consumption of various elements within the semiconductor memory apparatus.

SUMMARY

In an embodiment, there may be provided a semiconductor memory apparatus. The semiconductor memory apparatus may include a write data bus inversion unit configured to invert a level of an input data and generate an inversion change data when a majority of the input data have a predetermined level. The semiconductor memory apparatus may include a write data polarity change unit configured to receive a write signal and a first bank address signal, invert a level of the inversion change data, and generate a polarity change data.

In an embodiment, there may be provided a semiconductor memory apparatus. The semiconductor memory apparatus may include a read data polarity change unit configured to invert a level of data outputted from a memory bank in response to a read polarity change signal and generate a polarity change data. The semiconductor memory apparatus may include a read data bus inversion unit configured to invert a level of the polarity change data and generate an inversion change data when a majority of the polarity change data have a predetermined level.

In an embodiment, there may be provided a semiconductor memory apparatus. The semiconductor memory apparatus may include a write data bus inversion unit configured to invert a level of a data and generate a write inversion change data when a majority of the data have a predetermined level. The semiconductor memory apparatus may include a write data polarity change unit configured to receive a write signal and a first bank address signal, invert a level of the write inversion change data, and generate a write polarity change data. The semiconductor memory apparatus may include a read data polarity change unit configured to invert a level of data outputted from a memory bank in response to a read signal and the first bank address signal and generate a read polarity change data. The data outputted from the memory bank may be substantially the same as the write polarity change data. The read data bus inversion unit may be configured to invert a level of the read polarity change data and generate a read inversion change data when a majority of the read polarity change data have a predetermined level.

DETAILED DESCRIPTION

Various embodiments are generally provided toward a semiconductor memory apparatus and data input/output method thereof. The semiconductor memory apparatus and data input/output method thereof may be capable of inverting levels of data transmitted through a data transmission line during a write operation and of restoring the inverted levels of data during a read operation according to the disposition of a memory bank where the data is stored into. In the embodiments, for example, a unit may include a device or a device may include a unit.

Figure 1:
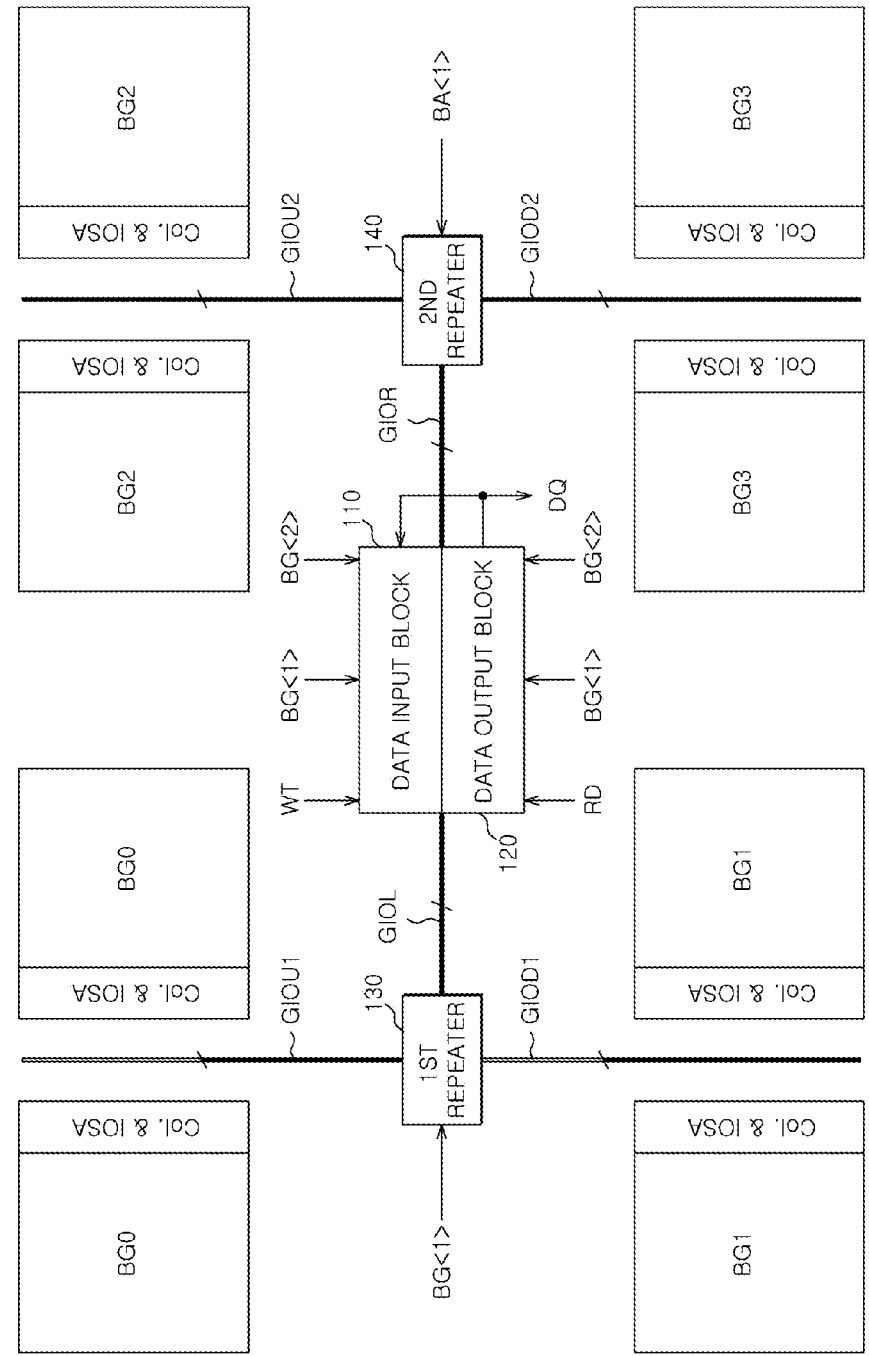
FIG. 1 is a block diagram illustrating a representation of an example of a semiconductor memory apparatus in accordance with an embodiment.

Referring to FIG. 1, in accordance with an example of an embodiment, the semiconductor memory apparatus 1 may include a plurality of memory banks, a data input block 110, and a first repeater 130. The semiconductor memory apparatus may include a second repeater 140, and a data output block 120. FIG. 1 illustrates a representation of an example of the semiconductor memory apparatus 1 including first to fourth memory banks BG0, BG1, BG2, and BG3, the number of which will not be limited and may be greater. The first to fourth memory banks BG0, BG1, BG2, and BG3 may be disposed to be split. Each of the split first to fourth memory banks BG0, BG1, BG2, and BG3 may include a column decoder circuit Col. and an input/output sense amplifier IOSA. The column decoder circuit Col. may select a column line of a corresponding one of the first to fourth memory banks BG0, BG1, BG2, and BG3. The input/output sense amplifier IOSA may amplify data to be stored into a corresponding one of the first to fourth memory banks BG0, BG1, BG2, and BG3. The input/output sense amplifier IOSA may amplify and output data stored in a corresponding one of the first to fourth memory banks BG0, BG1, BG2, and BG3. The first and second memory banks BG0 and BG1 may be left-sided banks disposed in left side, relatively. The third and fourth memory banks BG2 and BG3 may be right-sided banks disposed in right side, relatively. The first and third memory banks BG0 and BG2 may be upper-sided banks disposed in the upper side, relatively. The second and fourth memory banks BG1 and BG3 may be lower-sided banks disposed in the lower side, relatively.

The data input block 110 may receive data transmitted from an external apparatus through a data pad DQ during the write operation of the semiconductor memory apparatus 1. The data pad DQ may be coupled to a bus communicating with the external apparatus. The data input block 110 may invert the data received through the data pad DQ according to a write signal WT and a first bank address signal BG<1>. The data input block 110 may invert a level of the data according to the data level. The data input block 110 may invert the level of the data twice in maximum. The data input block 110 may be coupled to a first data transmission line GIOL. The data input block 110 may be coupled to a second data transmission line GIOR. Areas among the first to fourth memory banks BG0, BG1, BG2, and BG3 may be located in the peripheral circuit area. The first and second data transmission lines GIOL and GIOR may be disposed in a peripheral area of the semiconductor memory apparatus 1. The data input block 110 may output the data inverted by the data input block 110 to one of the first and second data transmission lines GIOL and GIOR according to a second bank address signal BG<2>. The first bank address signal BG<1> may include information for selecting one of the upper-sided banks and the lower-sided banks. The second bank address signal BG<2> may include information for selecting one of the left-sided banks and the right-sided banks.

The first repeater 130 may be coupled to the data input block 110 through the first data transmission line GIOL. The first repeater 130 may receive data transmitted through the first data transmission line GIOL. The first repeater 130 may be coupled to a first upper-sided bank data transmission line GIOU1 and a first lower-sided bank data transmission line GIOD1. The first upper-sided bank data transmission line GIOU1 may be disposed between the split banks of the first memory bank BG0. The first upper-sided bank data transmission line GIOU1 may couple the first memory bank BG0 and the first repeater 130. The first lower-sided bank data transmission line GIOD1 may be disposed between the split banks of the second memory bank BG1. The first lower-sided bank data transmission line GIOD1 may couple the second memory bank BG1 and the first repeater 130. The first repeater 130 may transfer the data transmitted through the first data transmission line GIOL to one of either the first upper-sided bank data transmission line GIOU1 or the first lower-sided bank data transmission line GIOD1 according to the first bank address signal BG<1>. The first memory bank BG0 may store the data transmitted through the first upper-sided bank data transmission line GIOU1. The second memory bank BG1 may store the data transmitted through the first lower-sided bank data transmission line GIOD1.

The second repeater 140 may be coupled to the data input block 110 through the second data transmission line GIOR. The second repeater 140 may receive data transmitted through the second data transmission line GIOR. The second repeater 140 may be coupled to a second upper-sided bank data transmission line GIOU2 and a second lower-sided bank data transmission line GIOD2. The second upper-sided bank data transmission line GIOU2 may be located between the split banks of the third memory bank BG2. The second upper-sided bank data transmission line GIOU2 may couple the third memory bank BG2 and the second repeater 140. The second lower-sided bank data transmission line GIOD2 may be located between the split banks of the fourth memory bank BG3. The second lower-sided bank data transmission line GIOD2 may couple the fourth memory bank BG3 and the second repeater 140. The second repeater 140 may transfer the data transmitted through the second data transmission line GIOR to one of either the second upper-sided bank data transmission line GIOU2 or the second lower-sided bank data transmission line GIOD2 according to the first bank address signal BG<1>. The third memory bank BG2 may store the data transmitted through the second upper-sided bank data transmission line GIOU2. The fourth memory bank BG 3 may store the data transmitted through the second lower-sided bank data transmission line GIOD2.

The data output block 120 may output to the external apparatus the data stored in the first to fourth memory banks BG0, BG1, BG2, and BG3 through the first and second data transmission lines GIOL and GIOR and the data pad DQ during the read operation of the semiconductor memory apparatus 1. The data stored in the first to fourth memory banks BG0, BG1, BG2, and BG3 may be transmitted through the first and second data transmission lines GIOL and GIOR by the first and second repeaters 130 and 140. The data output block 120 may receive the data transmitted through the first and second data transmission lines GIOL and GIOR. The data output block 120 may receive data outputted from one of the left-sided banks and the right-sided banks according to the second bank address signal BG<2>. The data output block 120 may invert the level of the data transmitted through one of the first and second data transmission lines GIOL and GIOR based on a read signal RD and the first bank address signal BG<1>. The data output block 120 may invert the level of the data transmitted through the first and second data transmission lines GIOL and GIOR based on the level of the data transmitted through the first and second data transmission lines GIOL and GIOR. The data output block 120 may recover the level of the data inverted by the data input block 110 and stored in corresponding one of the first to fourth memory banks BG0, BG1, BG2, and BG3. The data output block 120 may output the recovered data to the external apparatus through the data pad DQ.

Figure 2:
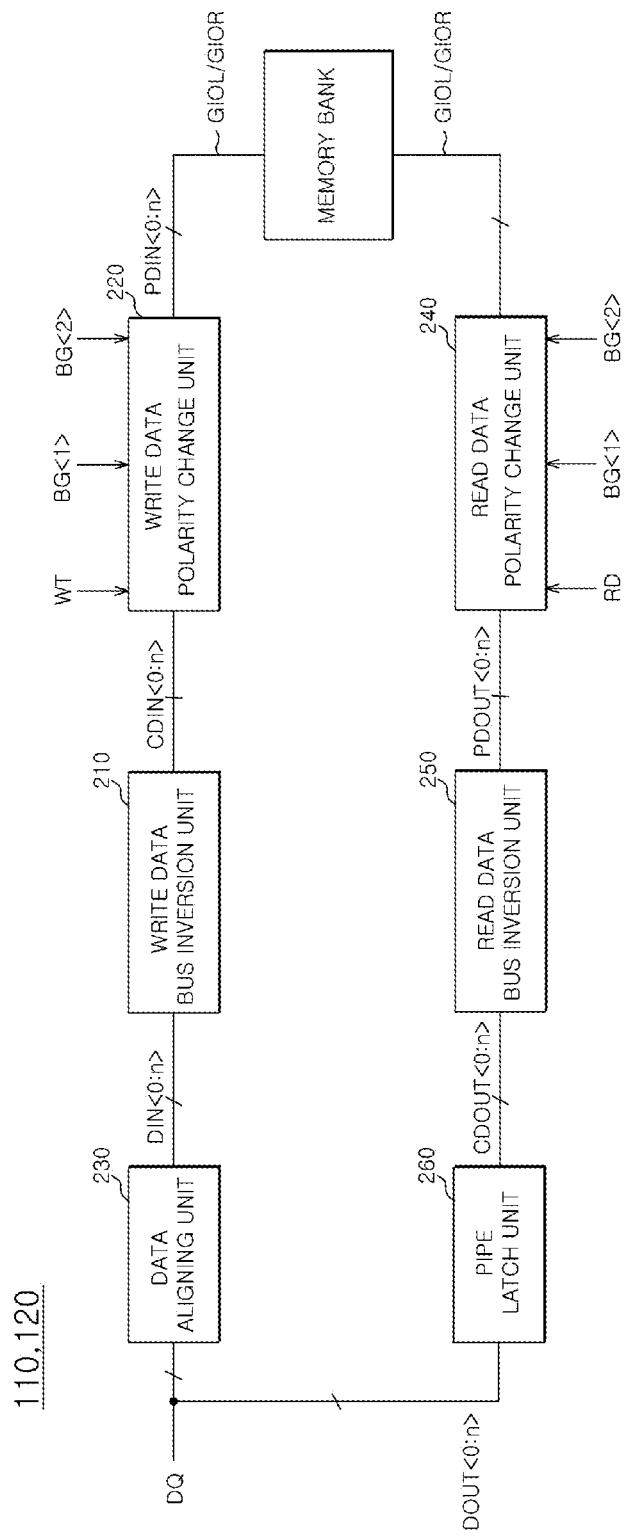
FIG. 2 is a block diagram illustrating a representation of an example of a data input block and a data output block in accordance with an embodiment.

FIG. 2 is a block diagram illustrating a representation of an example of the data input block 110 and the data output block 120 in accordance with an example of an embodiment. Referring to FIG. 2, the data input block 110 may include a write data bus inversion unit 210 and a write data polarity change unit 220. The write data bus inversion unit 210 may generate inversion change data CDIN<0:n> by inverting input data DIN<0:n>. The write data bus inversion unit 210 may generate inversion change data CDIN<0:n> by inverting input data DIN<0:n> when a majority of the input data DIN<0:n> have a predetermined level. The inversion change data CDIN<0:n> may be write inversion change data. For example, the write data bus inversion unit 210 may generate the inversion change data CDIN<0:n> by inverting the input data DIN<0:n> when the majority of the input data DIN<0:n> have a level of "0". For example, the write data bus inversion unit 210 may generate the inversion change data CDIN<0:n>, the inversion change data CDIN<0:n> having substantially the same level as the input data DIN<0:n>, by maintaining the input data DIN<0:n> when the majority of the input data DIN<0:n> have a level of "1". The write data bus inversion unit 210 may work without a control signal, or may selectively work by the control signal.

The write data polarity change unit 220 may receive the inversion change data CDIN<0:n> from the write data bus inversion unit 210. The write data polarity change unit 220 may change polarity of the inversion change data CDIN<0:n>. The write data polarity change unit 220 may output the polarity-changed inversion change data CDIN<0:n> as polarity change data PDIN<0:n> based on the write signal WT and the first bank address signal BG<1>. The polarity change data PDIN<0:n> may be write polarity change data. The write data polarity change unit 220 may invert the inversion change data CDIN<0:n> and output the polarity change data PDIN<0:n>. The write data polarity change unit 220 may invert the inversion change data CDIN<0:n> and output the polarity change data PDIN<0:n> when, for example, the write signal WT is enabled and the first bank address signal BG<1> has a logic high level. The write data polarity change unit 220 may maintain the inversion change data CDIN<0:n> and output the polarity change data PDIN<0:n> having substantially the same level as the inversion change data CDIN<0:n>, when the write signal WT is enabled and the first bank address signal BG<1> has a logic low level. As described above with reference to FIG. 1, the first bank address signal BG<1> may include the information for selecting one of the upper-sided banks and the lower-sided banks. For example, when the first bank address signal BG<1> has a logic high level for selecting the lower-sided banks during the write operation, the write data polarity change unit 220 may invert the inversion change data CDIN<0:n> and output the inverted inversion change data CDIN<0:n> as the polarity change data PDIN<0:n>. In an embodiment, for example, when the first bank address signal BG<1> has a logic low level for selecting the upper-sided banks during the write operation, the write data polarity change unit 220 may maintain the inversion change data CDIN<0:n> and output the inversion change data CDIN<0:n> as the polarity change data PDIN<0:n>.

The data input block 110 may further include a data aligning unit 230. The data aligning unit 230 may generate the input data DIN<0:n> by arranging data inputted through the data pad DQ. The data inputted through the data pad DQ may serial data inputted from the external apparatus. The data aligning unit 230 may generate the input data DIN<0:n> by arranging the serial data into parallel data.

During the write operation, the polarity change data PDIN<0:n> outputted from the write data polarity change unit 220 may be transmitted through the first and second data transmission lines GIOL and GIOR. The write data polarity change unit 220 may output the polarity change data PDIN<0:n> to one of the first and second data transmission lines GIOL and GIOR based on the second bank address signal BG<2>. FIG. 2 does not illustrate the first and second repeaters 130 and 140, the first and second upper-sided bank data transmission lines GIOU1 and GIOU2, and the first and second lower-sided bank data transmission lines GIOD1 and GIOD2. FIG. 1 does illustrate the first and second repeaters 130 and 140, the first and second upper-sided bank data transmission lines GIOU1 and GIOU2, and the first and second lower-sided bank data transmission lines GIOD1 and GIOD2. The polarity change data PDIN<0:n> may be transmitted through the first and second data transmission lines GIOL and GIOR and may be stored into corresponding one of the first to fourth memory banks BG0, BG1, BG2, and BG3 (i.e., memory bank).

The data output block 120 may include a read data polarity change unit 240 and a read data bus inversion unit 250. The read data polarity change unit 240 may receive data stored in the first to fourth memory banks BG0, BG1, BG2, and BG3. The read data polarity change unit 240 may receive data stored in the first to fourth memory banks BG0, BG1, BG2, and BG3 through one of the first and second data transmission lines GIOL and GIOR based on the second bank address signal BG<2>. The data stored in the first to fourth memory banks BG0, BG1, BG2, and BG3 may be substantially the same as the polarity change data PDIN<0:n> inverted by the write data polarity change unit 220. The read data polarity change unit 240 may generate polarity change data PDOUT<0:n> by receiving the data stored in the first to fourth memory banks BG0, BG1, BG2, and BG3 and inverting data outputted from the first to fourth memory banks BG0, BG1, BG2, and BG3 in response to the read signal RD and the first bank address signal BG<1>. The polarity change data PDOUT<0:n> may be read polarity change data. When data is outputted from the lower-sided banks during the read operation, the read data polarity change unit 240 may generate the polarity change data PDOUT<0:n> by inverting the data outputted from the lower-sided banks. When data is outputted from the upper-sided banks during the read operation, the read data polarity change unit 240 may generate the polarity change data PDOUT<0:n> by maintaining the data outputted from the lower-sided banks. The read data polarity change unit 240 may recover the level of the data inverted by the write data polarity change unit 220.

The read data bus inversion unit 250 may receive the polarity change data PDOUT<0:n> outputted from the read data polarity change unit 240. The read data bus inversion unit 250 may generate inversion change data CDOUT<0:n>. The read data bus inversion unit 250 may generate inversion change data CDOUT<0:n> by inverting the polarity change data PDOUT<0:n> when, for example, a majority of the polarity change data PDOUT<0:n> have a predetermined level. The inversion change data CDOUT<0:n> may be read inversion change data. For example, the read data bus inversion unit 250 may generate the inversion change data CDOUT<0:n> by inverting the polarity change data PDOUT<0:n> when the majority of the polarity change data PDOUT<0:n> have a level of "1". For example, the read data bus inversion unit 250 may generate the inversion change data CDOUT<0:n> having substantially the same level as the polarity change data PDOUT<0:n>, by maintaining the polarity change data PDOUT<0:n> when the majority of the polarity change data PDOUT<0:n> have a level of "0". The write data bus inversion unit 210 may work without a control signal, or may selectively work by the control signal. The read data bus inversion unit 250 may recover the level of the data inverted by the write data bus inversion unit 210.

The data output block 120 may further include a pipe latch unit 260. The pipe latch unit 260 may receive the inversion change data CDOUT<0:n> outputted from the read data bus inversion unit 250 and generate output data DOUT<0:n>. The pipe latch unit 260 may generate the output data DOUT<0:n>, the output data DOUT<0:n> may be serial data. The pipe latch unit 260 may generate the output data DOUT<0:n> by arranging the inversion change data CDOUT<0:n>, the inversion change data CDOUT<0:n> may be parallel data. The output data DOUT<0:n> may outputted to the external apparatus through the data pad DQ.

As illustrated in FIG. 2, with regards to the data input path, the write data bus inversion unit 210 may be located prior to the write data polarity change unit 220. In the data output path, the read data polarity change unit 240 may be located prior to the read data bus inversion unit 250 in order to sequentially recover the level of the data sequentially inverted by one or both of the write data bus inversion unit 210 and the write data polarity change unit 220. In an embodiment, the read data polarity change unit 240 may be coupled between the read data bus inversion unit 250 and a memory bank. In an embodiment, the write data bus inversion unit 210 may be coupled between the data aligning unit 230 and the write data polarity change unit 220.

Figure 3:
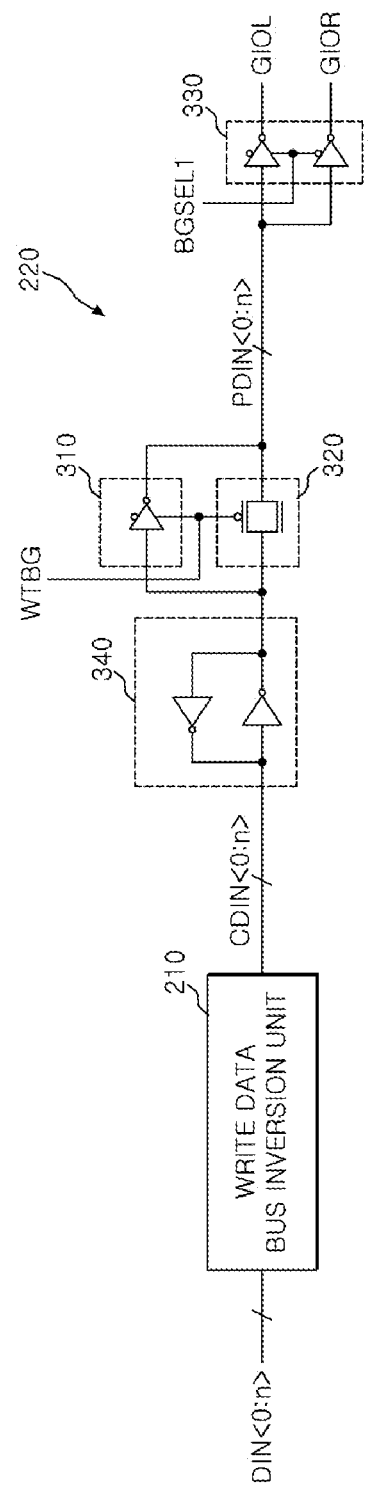
FIG. 3 is a block diagram illustrating a representation of an example of a write data polarity change unit and a write data bus inversion unit illustrated in FIG. 2.

FIG. 3 is a block diagram illustrating a representation of an example of the write data polarity change unit 220 and the write data bus inversion unit 210 illustrated in FIG. 2. Referring to FIG. 3, the write data bus inversion unit 210 may receive the input data DIN<0:n>. The write data bus inversion unit 210 may be located before the write data polarity change unit 220. The write data bus inversion unit 210 may generate the inversion change data CDIN<0:n> by receiving the input data DIN<0:n>. In an embodiment, the write data bus inversion unit 210 may be coupled between the write data polarity change unit 220 and the data aligning unit 230.

The write data polarity change unit 220 may include an inversion section 310 and a non-inversion section 320. The inversion section 310 may generate the polarity change data PDIN<0:n> by inverting the inversion change data CDIN<0:n>. The inversion section 310 may generate the polarity change data PDIN<0:n> in response to a write polarity change signal WTBG. The write polarity change signal WTBG may be generated based on, for example, the write signal WT and the first bank address signal BG<1>. The write polarity change signal WTBG may be, for example, enabled when the write signal WT is enabled and the first bank address signal BG<1> has a logic high level. The write polarity change signal WTBG may be disabled, for example, when the write signal WT is enabled and the first bank address signal BG<1> has a logic low level. The inversion section 310 may generate the polarity change data PDIN<0:n> by inverting the inversion change data CDIN<0:n>. The inversion section 310 may generated the polarity change data PDIN<0:n> when the write polarity change signal WTBG is enabled. The non-inversion section 320 may generate the polarity change data PDIN<0:n> by maintaining the inversion change data CDIN<0:n> in response to the write polarity change signal WTBG. The non-inversion section 320 may generate the polarity change data PDIN<0:n> by non-inversely driving the inversion change data CDIN<0:n> when the write polarity change signal WTBG is, for example, disabled.

The write data polarity change unit 220 may further include a transmission selection section 330. The transmission selection section 330 may transmit the polarity change data PDIN<0:n> through one of the first and second data transmission lines GIOL and GIOR. The transmission selection section 330 may transmit the polarity change data PDIN<0:n> through one of the first and second data transmission lines GIOL and GIOR in response to transmission control signal BGSEL1 The transmission control signal BGSEL1 may be generated based on the write signal WT and the second bank address signal BG<2>. For example, the transmission control signal BGSEL1 may be enabled when the write signal WT is enabled and the second bank address signal BG<2> has a logic high level. The transmission control signal BGSEL1 may be disabled, for example, when the write signal WT is enabled and the second bank address signal BG<2> has a logic low level. The transmission selection section 330 may transmit the polarity change data PDIN<0:n> through the first data transmission line GIOL when, for example, the transmission control signal BGSEL1 is enabled. The transmission selection section 330 may transmit the polarity change data PDIN<0:n> through the second data transmission line GIOR when, for example, the transmission control signal BGSEL1 is disabled. The write data polarity change unit 220 may further include a latch section 340 disposed next to the write data bus inversion unit 210 in order to latch the inversion change data CDIN<0:n>. In an embodiment, write data polarity change unit 220 may further include a latch section 340 coupled between the write data bus inversion unit 210 and both the inversion section 310 and non inversion section 320, in order to latch the inversion change data CDIN<0:n>.

Figure 4:
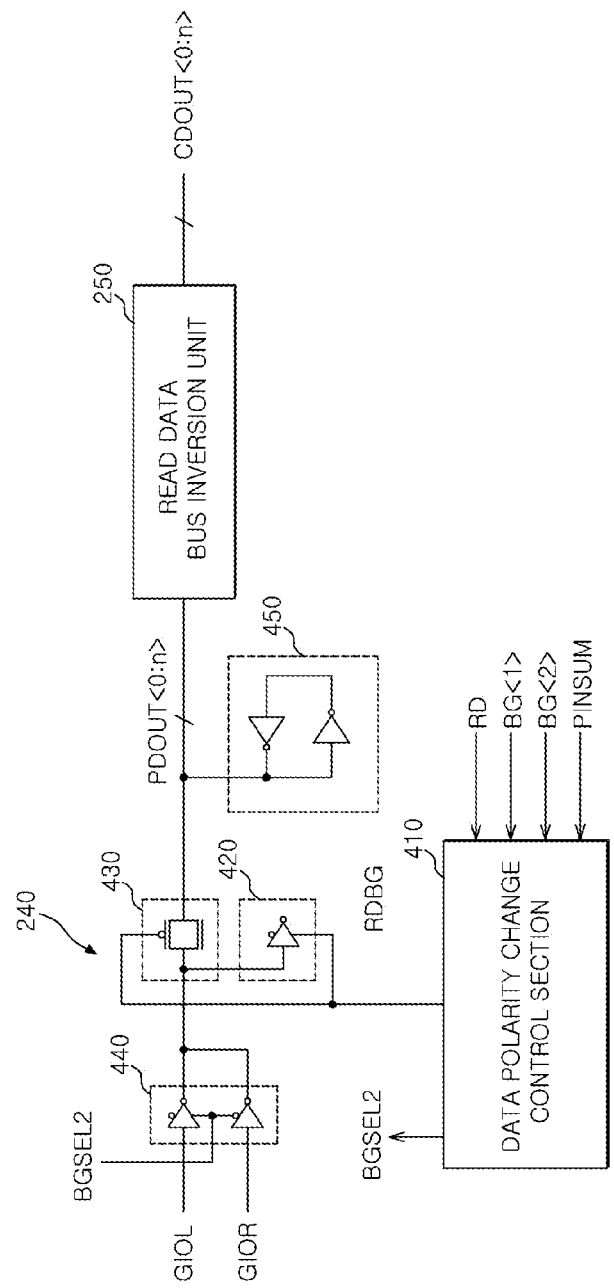
FIG. 4 is a block diagram illustrating a representation of an example of a read data polarity change unit and a read data bus inversion unit illustrated in FIG. 2.

FIG. 4 is a block diagram illustrating a representation of an example of the read data polarity change unit 240 and the read data bus inversion unit 250 illustrated in FIG. 2. Referring to FIG. 4, the read data polarity change unit 240 may receive data transmitted through one of the first and second data transmission lines GIOL and GIOR. The read data polarity change unit 240 may be disposed before the read data bus inversion unit 250 in the data output path. The read data bus inversion unit 250 may receive the polarity change data PDOUT<0:n> outputted from the read data polarity change unit 240, and generate the inversion change data CDOUT<0:n>. In an embodiment, the read data polarity change unit 240 may be coupled between the first and second data transmission lines GIOL and GIOR and the read data bus inversion unit 250.

The read data polarity change unit 240 may include a data polarity change control section 410, an inversion section 420, and a non-inversion section 430. The data polarity change control section 410 may generate read polarity change signal RDBG based on the read signal RD, an output control signal, and the first bank address signal BG<1>. For example, the output control signal may be a pipe latch control signal PINSUM. The semiconductor memory apparatus 1 may work in high speed and may continuously perform a plurality of read operations. For example, the semiconductor memory apparatus 1 may perform the plurality of read operations upon receiving a read command from the external apparatus, and may output data through the data pad DQ after a predetermined latency from the reception of the read command from the external apparatus. The pipe latch unit 260 described with reference to FIG. 2 may store the inversion change data CDOUT<0:n> outputted from the read data bus inversion unit 250 according to the pipe latch control signal PINSUM generated after a predetermined latency from when the read signal RD is enabled. For example, the data polarity change control section 410 may generate the read polarity change signal RDBG synchronized to the pipe latch control signal PINSUM after the read signal RD is enabled. The data polarity change control section 410 may enable the read polarity change signal RDBG when, for example, the read signal RD is enabled and the first bank address signal BG<1> has a logic high level. The data polarity change control section 410 may disable the read polarity change signal RDBG when, for example, the read signal RD is enabled and the first bank address signal BG<1> has a logic low level. The data polarity change control section 410 may store the read polarity change signal RDBG, and may output the stored read polarity change signal RDBG when, for example, the pipe latch control signal PINSUM is enabled. The data polarity change control section 410 may further generate reception control signal BGSEL2 based on the pipe latch control signal PINSUM and the second bank address signal BG<2>. The reception control signal BGSEL2 will be described later.

The inversion section 420 may generate the polarity change data PDOUT<0:n> by inverting data transmitted through the first and second data transmission lines GIOL and GIOR in response to the read polarity change signal RDBG. The inversion section 420 may generate the polarity change data PDOUT<0:n> by inversely driving the data transmitted through the first and second data transmission lines GIOL and GIOR when, for example, the read polarity change signal RDBG is enabled.

The non-inversion section 430 may generate the polarity change data PDOUT<0:n> by maintaining the data transmitted through the first and second data transmission lines GIOL and GIOR in response to the read polarity change signal RDBG. The non-inversion section 430 may generate the polarity change data PDOUT<0:n> by non-inversely driving the data transmitted through the first and second data transmission lines GIOL and GIOR when, for example, the read polarity change signal RDBG is disabled.

The read data polarity change unit 240 may further include a reception selection section 440. The reception selection section 440 may receive data transmitted through one of the first and second data transmission lines GIOL and GIOR. The reception selection section 440 may receive data transmitted through one of the first and second data transmission lines GIOL and GIOR in response to the reception control signal BGSEL2. The reception control signal BGSEL2 may be generated based on the pipe latch control signal PINSUM and the second bank address signal BG<2>. The reception control signal BGSEL2 may be enabled when, for example, the pipe latch control signal PINSUM is enabled and the second bank address signal BG<2> has a logic high level. The reception control signal BGSEL2 may be disabled when, for example, the pipe latch control signal PINSUM is enabled and the second bank address signal BG<2> has a logic low level. The reception selection section 440 may receive the data transmitted through the first data transmission lines GIOL when, for example, the reception control signal BGSEL2 is enabled. The reception selection section 440 may receive the data transmitted through the second data transmission lines GIOR when, for example, the reception control signal BGSEL2 is disabled. The reception selection section 440 may output the data transmitted through the first and second data transmission lines GIOL and GIOR to the inversion section 420 and the non-inversion section 430. The read data polarity change unit 240 may further include a latch section 450 for latching the polarity change data PDOUT<0:n>.

Figure 5:
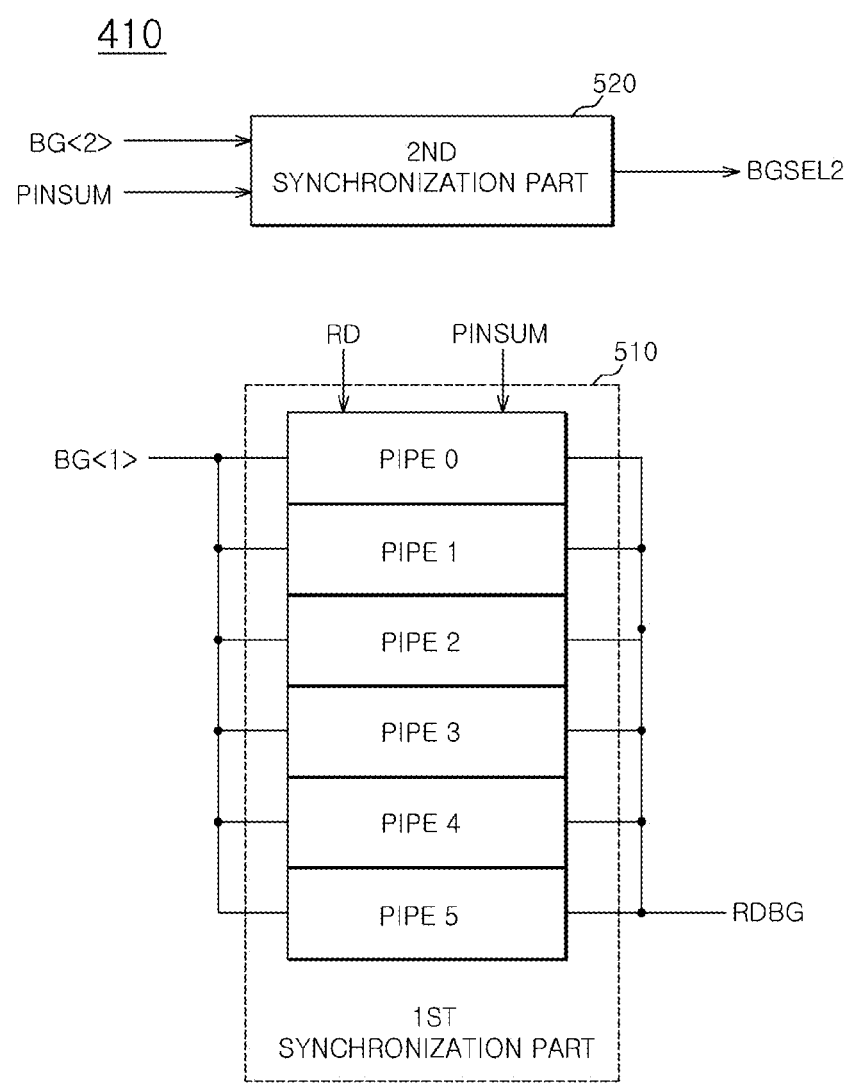
FIG. 5 is a block diagram illustrating a representation of an example of a data polarity change control section illustrated in FIG. 4.

FIG. 5 is a block diagram illustrating a representation of an example of the data polarity change control section 410 illustrated in FIG. 4. Referring to FIG. 5, the data polarity change control section 410 may include a first synchronization part 510 and a second synchronization part 520. The first synchronization part 510 may receive the read signal RD, the pipe latch control signal PINSUM, and the first bank address signal BG<1>. The first synchronization part 510 may store the logic level of the first bank address signal BG<1> whenever, for example, the read signal RD is enabled. The first synchronization part 510 may generate the read polarity change signal RDBG according to the stored logic level of the first bank address signal BG<1> whenever, for example, the pipe latch control signal PINSUM is enabled. The first synchronization part 510 may include a plurality of pipes. FIG. 5 illustrates, for example, the first synchronization part 510 including 6 pipes, the number of pipes however is not be limited and may be more or less than 6. The plurality of pipes may sequentially store the logic level of the first bank address signal BG<1> whenever, for example, the read signal RD is enabled. For example, the pipe 0 may store the logic level of the first bank address signal BG<1> when the read signal RD is firstly enabled, and the pipe 1 may store the logic level of the first bank address signal BG<1> when the read signal RD is secondly enabled. For example, when the pipe 0 stores the logic high level of the first bank address signal BG<1> and the pipe 1 stores the logic low level of the first bank address signal BG<1>, the pipe 0 may enable the read polarity change signal RDBG when the pipe latch control signal PINSUM is first enabled and the pipe 1 may disable the read polarity change signal RDBG when the pipe latch control signal PINSUM is secondly enabled.

The second synchronization part 520 may generate the reception control signal BGSEL2 by receiving the pipe latch control signal PINSUM and the second bank address signal BG<2>. The second synchronization part 520 may enable the reception control signal BGSEL2 according to the logic level of the second bank address signal BG<2> when, for example, the pipe latch control signal PINSUM is enabled. The pipe latch control signal PINSUM may be a merged signal of a plurality of output control signals. For example, whenever the pipe latch control signal PINSUM is enabled, the second synchronization part 520 may enable the reception control signal BGSEL2 when the second bank address signal BG<2> has the logic high level and may disable the reception control signal BGSEL2 when the second bank address signal BG<2> has the logic low level.

An operation of the semiconductor memory apparatus 1 described with reference to FIGS. 1 to 5 may be as follows. The semiconductor memory apparatus 1 may perform data input and output operations for the first to fourth memory banks BG0, BG1, BG2, and BG3 according to the write signal WT, the read signal RD and the first and second bank address signals BG<1> and BG<2>. Hereinafter, examples of the write operation and the read operation of the semiconductor memory apparatus 1 will be described. During the example of the write operation, data of "0" is stored into the first memory bank BG0 and data of "1" is stored into the second memory bank BG1. During the example of the read operation, the data respectively stored in the first and second memory banks BG0 and BG1 are outputted. Also, it may be assumed, for example, that the write data bus inversion unit 210 and the read data bus inversion unit 250 do not operate as expected or perform the non-inversion operation. The first memory bank BG0 may belong to the upper-sided banks and the left-sided banks, and thus the first bank address signal BG<1> may have the logic low level and the second bank address signal BG<2> may have the logic high level. The write data polarity change unit 220 of the data input block 110 may maintain the data of "0" in response to the write polarity change signal WTBG, and the transmission selection section 330 may transmit the data of "0" through the first data transmission lines GIOL in response to the transmission control signal BGSEL1. The first repeater 130 may transfer the data transmitted through the first data transmission line GIOL to the first upper-sided bank data transmission line GIOU1, and the first memory bank BG0 may receive and store data transmitted through the first upper-sided bank data transmission line GIOU1. Then, the second memory bank BG1 may belong to the lower-sided banks and the left-sided banks, and thus the first bank address signal BG<1> may have the logic high level and the second bank address signal BG<2> may have the logic high level. The write data polarity change unit 220 may invert the data of "1" and transmit the data of "0" through the first data transmission lines GIOL. The level of the data transmitted through the first data transmission line GIOL may be the same as the data previously transmitted through the first data transmission line GIOL. For example, the first data transmission line GIOL may not toggle and the current consumed in the first data transmission line GIOL may be reduced. The first repeater 130 may transfer the data of "0" transmitted through the first data transmission line GIOL to the first lower-sided bank data transmission line GIOD1, and the second memory bank BG1 may receive and store data transmitted through the first lower-sided bank data transmission line GIOD1.

Then, the semiconductor memory apparatus 1 may perform the read operation for outputting data stored in the first and second memory banks BG0 and BG1. The first repeater 130 may transfer the data of "0" outputted from the first memory bank BG0 and transferred through the first upper-sided bank data transmission line GIOU1 to the first data transmission line GIOL. The reception selection section 440 may receive the data of "0" transmitted through the first data transmission line GIOL in response to the reception control signal BGSEL2, and the read data polarity change unit 240 may maintain and output the data of "0" in response to the read polarity change signal RDBG. For example, the data output block 120 may output the data, which is the same as received by the data input block 110, to the data pad DQ. Then, the first repeater 130 may transfer the data of "0" outputted from the second memory bank BG1 and transmitted through the first lower-sided bank data transmission line GIOD1 to the first data transmission line GIOL. The first data transmission line GIOL may transmit the data having the same level as the data previously transmitted, and thus the current consumed in the first data transmission line GIOL may be reduced. The reception selection section 440 may receive the data of "0" transmitted through the first data transmission line GIOL in response to the reception control signal BGSEL2, and the read data polarity change unit 240 may invert the data of "0" and output the data of "1" in response to the read polarity change signal RDBG. For example, the read data polarity change unit 240 may recover the data inverted by the write data polarity change unit 220 and is stored in the second memory bank BG1 to the original data. Therefore, the data output block 120 may output the data, which is the same as received by the data input block 110, to the data pad DQ.

When, for example, the data of "0" is continuously stored in the first memory bank BG0 and the data of "1" is continuously stored in the second memory bank BG1, the level of the data transmitted through the first data transmission line GIOL by the write data polarity change unit 220 may be continuously "0". When, for example, the data stored in the first memory bank BG0 is outputted and the data stored in the second memory bank BG1 is outputted, the data stored in the second memory bank BG1 may be recovered to the data of "1" by the read data polarity change unit 240 while the level of the data transmitted through the first data transmission line GIOL may be continuously "0".

Therefore, the semiconductor memory apparatus 1 may reduce the power consumption when the semiconductor memory apparatus 1 stores and outputs the data of the predetermined pattern through the write data polarity change unit 220 and the read data polarity change unit 240. Also, the semiconductor memory apparatus 1 may variously change the data to be stored into the memory bank, and recover the data to be outputted from the memory bank through co-work of the write data bus inversion unit 210 and the read data bus inversion unit 250 and the write data polarity change unit 220 and the read data polarity change unit 240.

Figure 6:
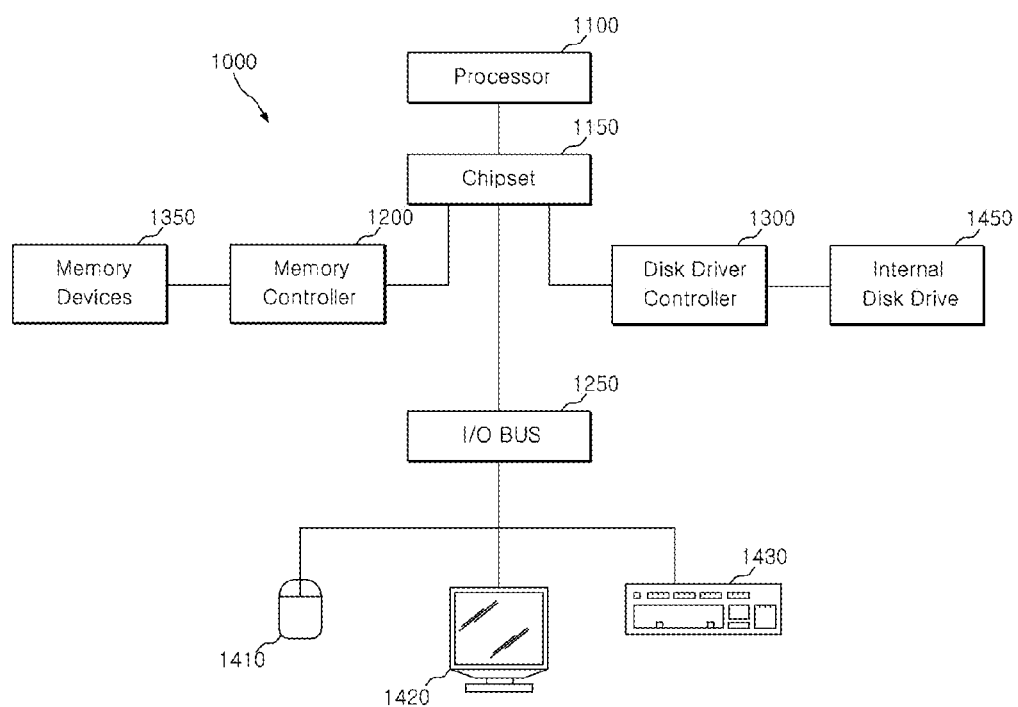
FIG. 6 illustrates a block diagram of an example of a representation of a system employing a semiconductor memory apparatus and data input/output method thereof in accordance with the various embodiments discussed above with relation to FIGS. 1-5.

The semiconductor memory apparatus and data input/output method thereof discussed above (see FIGS. 1-5) are particular useful in the design of memory devices, processors, and computer systems. For example, referring to FIG. 6, a block diagram of a system employing the semiconductor memory apparatus and data input/output method thereof in accordance with the various embodiments are illustrated and generally designated by a reference numeral 1000. The system 1000 may include one or more processors or central processing units ("CPUs") 1100. The CPU 1100 may be used individually or in combination with other CPUs. While the CPU 1100 will be referred to primarily in the singular, it will be understood by those skilled in the art that a system with any number of physical or logical CPUs may be implemented.

A chipset 1150 may be operably coupled to the CPU 1100. The chipset 1150 is a communication pathway for signals between the CPU 1100 and other components of the system 1000, which may include a memory controller 1200, an input/output ("I/O") bus 1250, and a disk drive controller 1300. Depending on the configuration of the system, any one of a number of different signals may be transmitted through the chipset 1150, and those skilled in the art will appreciate that the routing of the signals throughout the system 1000 can be readily adjusted without changing the underlying nature of the system.

As stated above, the memory controller 1200 may be operably coupled to the chipset 1150. The memory controller 1200 may include at least one semiconductor memory apparatus as discussed above with reference to FIGS. 1-5. Thus, the memory controller 1200 can receive a request provided from the CPU 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the at least one semiconductor memory apparatus as discussed above with relation to FIGS. 1-5, the memory devices 1350 may include a plurality of word lines and a plurality of bit lines for defining a plurality of memory cells. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420 and 1430. The I/O devices 1410, 1420 and 1430 may include a mouse 1410, a video display 1420, or a keyboard 1430.

The I/O bus 1250 may employ any one of a number of communications protocols to communicate with the I/O devices 1410, 1420, and 1430. Further, the I/O bus 1250 may be integrated into the chipset 1150.

The disk drive controller 1450 (i.e., internal disk drive) may also be operably coupled to the chipset 1150. The disk drive controller 1450 may serve as the communication pathway between the chipset 1150 and one or more internal disk drives 1450. The internal disk drive 1450 may facilitate disconnection of the external data storage devices by storing both instructions and data. The disk drive controller 1300 and the internal disk drives 1450 may communicate with each other or with the chipset 1150 using virtually any type of communication protocol, including all of those mentioned above with regard to the I/O bus 1250.

It is important to note that the system 1000 described above in relation to FIG. 6 is merely one example of a system employing the semiconductor memory apparatus and data input/output method thereof as discussed above with relation to FIGS. 1-5. In alternate embodiments, such as cellular phones or digital cameras, the components may differ from the embodiments illustrated in FIG. 6.

While various embodiments have been described above, it will be understood to those skilled in the art that the embodiments described are by way of example only. Accordingly, the semiconductor memory apparatus and data input/output method thereof should not be limited based on the described embodiments. Rather, the semiconductor memory apparatus and data input/output method thereof described herein should only be limited in light of the claims that follow when taken in conjunction with the above description and accompanying drawings.

What is claimed is:

1. A semiconductor memory apparatus comprising:
   a write data bus inversion unit configured to invert an input data and generate an inversion change data when a majority of the input data have a predetermined level; and
   a write data polarity change unit configured to receive a write signal and a first bank address signal, invert the inversion change data, and generate a polarity change data.

2. The semiconductor memory apparatus of claim 1, wherein the write data polarity change unit comprises:
   an inversion section configured to invert the inversion change data in response to a write polarity change signal generated based on the write signal and the first bank address signal; and
   a non-inversion section configured to maintain the inversion change data in response to the write polarity change signal.

3. The semiconductor memory apparatus of claim 1, further comprising a transmission selection section configured to transmit the polarity change data through one of either a first or a second data transmission line in response to a transmission control signal generated based on the write signal and a second bank address signal.

4. The semiconductor memory apparatus of claim 3, further comprising:
   a first repeater coupled to the first data transmission line, and configured to receive the polarity change data and to transmit the received data to one of either a first memory bank or a second memory bank in response to the first bank address signal; and
   a second repeater coupled to the second data transmission line, and configured to receive the polarity change data and to transmit the received data to one of either a third memory bank or a fourth memory bank in response to the first bank address signal.

5. The semiconductor memory apparatus of claim 4, further comprising:
   a first upper-sided bank data transmission line disposed between split banks of the first memory bank and configured to couple the first memory bank to the first repeater;
   a first lower-sided bank data transmission line disposed between split banks of the second memory bank and configured to couple the second memory bank to the first repeater;
   a second upper-sided bank data transmission line disposed between split banks of the third memory bank and configured to couple the third memory bank to the second repeater; and
   a second lower-sided bank data transmission line disposed between split banks of the fourth memory bank and configured to couple the fourth memory bank to the second repeater.

6. The semiconductor memory apparatus of claim 1, further comprising a data aligning unit configured to receive data through a data pad, and to generate the input data by arranging the data.

7. The semiconductor memory apparatus of claim 5, wherein the data aligning unit is configured for receiving serial data from the data pad and for arranging the serial data into parallel data.

8. A semiconductor memory apparatus comprising:
   a write data bus inversion unit configured to invert an input data and generate a write inversion change data when a majority of the data have a predetermined level;
   a write data polarity change unit configured to receive a write signal and a first bank address signal, invert the write inversion change data, and generate a write polarity change data;
   a read data polarity change unit configured to invert data outputted from a memory bank in response to a read signal and the first bank address signal and generate a read polarity change data, wherein the data outputted from the memory bank is substantially the same as the write polarity change data; and
   a read data bus inversion unit configured to invert the read polarity change data and generate a read inversion change data when a majority of the read polarity change data have a predetermined level.

9. The semiconductor memory apparatus of claim 8, wherein the write data polarity change unit comprises a transmission selection section configured to transmit the write polarity change data through one of either a first or second data transmission line in response to the write signal and a second bank address signal.

10. The semiconductor memory apparatus of claim 9, wherein the read data polarity change unit comprises a reception selection section configured to receive the data outputted from the memory bank through one of either the first or second data transmission line based on an output control signal and the second bank address signal.

11. The semiconductor memory apparatus of claim 8, further comprising:
    a first repeater configured to transmit data transmitted through the first data transmission line to one of either a first memory bank or a second memory bank during a write operation, and to transmit data outputted from one of either the first memory bank or the second memory bank through the first data transmission line during a read operation, based on the first bank address signal; and a second repeater configured to transmit data transmitted through the second data transmission line to one of either a third memory bank or a fourth memory bank during the write operation, and to transmit data outputted from one of the third memory bank and the fourth memory bank through the second data transmission line during the read operation, based on the first bank address signal.

12. The semiconductor memory apparatus of claim 11, further comprising:
    a first upper-sided bank data transmission line disposed between split banks of the first memory bank and configured to couple the first memory bank to the first repeater;
    a first lower-sided bank data transmission line disposed between split banks of the second memory bank and configured to couple the second memory bank to the first repeater;
    a second upper-sided bank data transmission line disposed between split banks of the third memory bank and configured to couple the third memory bank to the second repeater; and
    a second lower-sided bank data transmission line disposed between split banks of the fourth memory bank and configured to couple the fourth memory bank to the second repeater.

13. The semiconductor memory apparatus of claim 11,
    wherein the first and second memory banks are left-sided banks,
    wherein the third and fourth memory banks are right-sided banks, and
    wherein the second bank address signal has information for selecting one of the left-sided banks and the right-sided banks.

14. The semiconductor memory apparatus of claim 11,
    wherein the first and third memory banks are upper-sided banks,
    wherein the second and fourth memory banks are lower-sided banks, and
    wherein the first bank address signal has information for selecting one of the upper-sided banks and the lower-sided banks.

* * * * *